(12) United States Patent
Müller et al.

(10) Patent No.: US 8,194,712 B2
(45) Date of Patent: Jun. 5, 2012

(54) MONOLITHICALLY INTEGRATED LASER DIODE CHIP HAVING A CONSTRUCTION AS A MULTIPLE BEAM LASER DIODE

(75) Inventors: Martin Müller, Regenstauf (DE); Günther Grönninger, Seubersdorf (DE); Alexander Behres, Kelheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 157 days.

(21) Appl. No.: 12/217,100

(22) Filed: Jun. 30, 2008

(65) Prior Publication Data

US 2009/0122823 A1 May 14, 2009

(30) Foreign Application Priority Data

Jun. 29, 2007 (DE) .......................... 10 2007 030 062

(51) Int. Cl.
*H01S 5/00* (2006.01)
(52) U.S. Cl. .............................. 372/50.12; 372/45.011
(58) Field of Classification Search .. 372/43.01–45.011, 372/50.12–50.122
See application file for complete search history.

(56) References Cited

U.S. PATENT DOCUMENTS

| | | | |
|---|---|---|---|
| 3,958,263 A | 5/1976 | Panish et al. | |
| 4,984,242 A * | 1/1991 | Scifres et al. | 372/45.011 |
| 5,212,706 A | 5/1993 | Jain | |
| 5,617,437 A | 4/1997 | Fukunaga | |
| 5,729,566 A * | 3/1998 | Jewell | 372/96 |
| 6,434,179 B1 | 8/2002 | Ebeling | |
| 6,584,130 B2 | 6/2003 | Hanke | |
| 6,628,694 B2 * | 9/2003 | Deng et al. | 372/96 |
| 6,816,524 B2 * | 11/2004 | Fukunaga | 372/45.011 |
| 6,956,881 B2 * | 10/2005 | Behringer et al. | 372/43.01 |
| 2003/0161369 A1 * | 8/2003 | Chang et al. | 372/45 |
| 2007/0053396 A1 | 3/2007 | DeVito et al. | |

OTHER PUBLICATIONS

Balakrishnan Ganesh et al.: "2.0 μm wavelength InAs quantum dashes grown on a GaAs substrate using a metamorphic buffer layer", Applied Physics Letters, AIP, American Institute of Physics, Melville, NY, Bd. 84, Nr. 12, Mar. 22, 2004, XP012060834 (3 pages).
Muller M. et al.: "Monolithically stacked high-power diode laser bars in quasi-continuous-wave operation exceeding 500 W", Proceedings of the SPIE, SPI, Bellingham VA, Bd. 6465, Jan. 24, 2007, XP009102517 (8 pages).
Search Report dated Jul. 4, 2008 issued for the counterpart European Patent Application No. EP 08 00 9484 (9 pages).

* cited by examiner

*Primary Examiner* — Jessica Stultz
*Assistant Examiner* — Xnning Niu
(74) *Attorney, Agent, or Firm* — Cozen O'Connor

(57) ABSTRACT

A monolithically integrated laser diode chip having a construction as a multiple beam laser diode, which, on a semiconductor substrate (3) comprised of GaAs, has at least two laser stacks (4a, 4b, 4c) which are arranged one above another and which each contain an active zone (7). The active zone (7) is in each case arranged between waveguide layers (8). The waveguide layers (8) each adjoin a cladding layer (6) at a side remote from the active zone. At least one of the waveguide layers (8) or cladding layers (6) of at least one laser stack (4a, 4b, 4c), comprises $Al_xGa_{1-x}As$, where $0 \leq x \leq 1$, and at least one additional material from main group III or V, such that the lattice mismatch between the at least one waveguide layer (8) or cladding layer (6) comprising the at least one additional element and the semiconductor substrate (3) composed of GaAs is reduced. This increases the lifetime of the laser diode chip.

14 Claims, 1 Drawing Sheet

MONOLITHICALLY INTEGRATED LASER DIODE CHIP HAVING A CONSTRUCTION AS A MULTIPLE BEAM LASER DIODE

RELATED APPLICATIONS

This patent application claims the priority of German patent application 10 2007 030 062.1 filed Jun. 29, 2007, the disclosure content of which is hereby incorporated by reference.

FIELD OF THE INVENTION

The invention relates to a monolithically integrated laser diode chip having a construction as a multiple beam laser diode.

BACKGROUND OF THE INVENTION

Such laser diode chips having a construction as a multiple beam laser diode are known for example from documents U.S. Pat. No. 5,212,706 and EP 1051783 B1. The laser diodes are usually grown as layer sequences, wherein the individual layers can comprise different materials and can consequently have different lattice constants. Different lattice constants of the substrate and of the layers grown lead to stresses, such that elastic energy is stored in the layer stack and forces act between adjacent layers, whereby the functioning of the laser diode chip can be impaired. If the force acting between two layers is too large, then lattice dislocations arise in or between the layers, whereby the function of the diode laser can be impaired further.

It is known from the document DE 10057698 A1 to eliminate this problem by means of an additional contact layer arranged between the first diode laser and the second diode laser, wherein the contact layer is formed such that a lattice mismatch between the substrate and the first diode laser is compensated for by a lattice mismatch having an opposite sign between the substrate and the contact layer.

By virtue of the stress compensated for in this way, however, local stresses and lattice mismatches between adjacent layers still exist or are even increased.

SUMMARY OF THE INVENTION

One object of the invention is to provide a monolithically integrated laser diode chip having a construction as a multiple beam laser diode in which local stresses and lattice mismatches between the semiconductor substrate composed of GaAs and at least one of the waveguide layers or cladding layers are reduced, such that the degradation of the laser diode chip is slowed down and the lifetime of the laser diode chip is thus increased.

This and other objects are attained in accordance with one aspect of the invention directed to a monolithically integrated laser diode chip having a construction as a multiple beam laser diode, which, on a semiconductor substrate composed of GaAs, has at least two laser stacks which are arranged one above another and which each contain an active zone arranged between waveguide layers. The waveguide layers each adjoin a cladding layer at a side remote from the active zone. At least one of the waveguide layers or cladding layers of at least one laser stack, comprises $Al_xGa_{1-x}As$, where $0 \leq x \leq 1$, and at least one additional element from main group III or V, such that the lattice mismatch between the at least one waveguide layer or cladding layer comprising the at least one additional element and the semiconductor substrate composed of GaAs is reduced.

The reduction of the lattice mismatches between the at least one waveguide layer or cladding layer and the semiconductor substrate results in a reduction of local stresses between the at least one waveguide layer or cladding layer and the semiconductor substrate, whereby forces between said layers are reduced. This slows down the degradation of the laser diode chip, whereby the lifetime of the laser diode chip is advantageously prolonged.

The ageing stability can be significantly increased by means of the at least one additional element from main group III or V with respect to $Al_xGa_{1-x}As$, where $0 \leq x \leq 1$, said element being contained in the at least one waveguide layer or cladding layer. Suitable additional elements from main group III or V are distinguished by the fact that the lattice constant of the waveguide layer or cladding layer is altered by the additional element in such a way that it approximates the lattice constant of the substrate containing GaAs.

A multistage monolithically integrated laser according to an embodiment of the invention can be used in a stable quasi-continuous (q-cw) operating mode, which results in a high thermal loading, wherein the advantages of a multistage monolithically integrated laser can be utilized. The advantages of a multistage monolithically integrated laser diode chip are, inter alia, a low current density, a low optical facet loading and lower costs as a result of a reduced mounting outlay.

Furthermore, as a result of the reduction of local lattice mismatches between at least one waveguide layer or cladding layer and the semiconductor substrate, in particular as a result of the reduction of the lattice mismatch between the semiconductor substrate composed of GaAs and the adjoining cladding layer, the flexure of the semiconductor substrate can be reduced since local stresses between said layers are reduced and forces between said layers are thus reduced. The risk of fracture of the semiconductor substrate is reduced as a result. Furthermore, the reduction of local stresses between the semiconductor substrate composed of GaAs and at least one waveguide layer or cladding layer results in an improvement in the fracture quality of the facets upon fracturing in laser bars. In addition, the reliability of the laser diode chip is increased.

Preferably, the additional element which is added to the at least one waveguide layer or cladding layer with respect to $Al_xGa_{1-x}As$, where $0 \leq x \leq 1$, and which reduces the lattice constant of $Al_xGa_{1-x}As$ and can therefore reduce a compressive stress present without the additional element, is P or N. An additional element which can be added to the at least one waveguide layer or cladding layer with respect to $Al_xGa_{1-x}As$, where $0 \leq x \leq 1$, and which increases the lattice constant of $Al_xGa_{1-x}As$ and can therefore reduce a tensile stress present without the additional element, is preferably In or Sb.

Preferably, the at least one additional element in the at least one waveguide layer or cladding layer reduces the lattice constant of said waveguide layer or cladding layer. This reduction of the lattice constant of said at least one waveguide layer or cladding layer has the advantage that the lattice constant of said at least one waveguide layer or cladding layer approximates the lattice constant of the semiconductor substrate that is to say the lattice constant of GaAs, if the lattice constant of the at least one waveguide layer or cladding layer without the at least one additional element were greater than the lattice constant of GaAs.

Furthermore, it is preferably provided that as a result of at least one additional element in the at least one waveguide layer or cladding layer, the lattice constant of said waveguide layer or cladding layer increases in order to approximate the lattice constant of the semiconductor substrate, that is to say to the lattice constant of GaAs, if the lattice constant of the at least one waveguide layer or cladding layer without the at least one additional layer were less than the lattice constant of GaAs.

Preferably, at least one waveguide layer and at least one cladding layer or at least two waveguide layers or at least two cladding layers comprise $Al_xGa_{1-x}As$, where $0 \leq x \leq 1$, and the at least one additional element. In this case, preferably, the at least one waveguide layer and the at least one cladding layer or the at least two waveguide layers or the at least two cladding layers comprise the at least one additional element in different concentrations.

By way of example, the two cladding layers of the first laser stack both comprise phosphorus as additional element with respect to $Al_xGa_{1-x}As$, where $0 \leq x \leq 1$. In this case, by way of example, the cladding layer facing the semiconductor substrate, which contains GaAs, has a higher concentration of phosphorus than the cladding layer facing the second laser stack.

In this case, the arrangement of the layers containing $Al_xGa_{1-x}As$, where $0 \leq x \leq 1$, and the additional element is not restricted to one of the laser stacks. As an alternative, it is also possible for at least one of the layers of the first laser stack and at least one of the layers of the second laser stack to comprise the additional element in the same or a different concentration.

One preferred configuration of the invention provides for each waveguide layer and each cladding layer of at least one laser stack to contain $Al_xGa_{1-x}As$, where $0 \leq x \leq 1$, and at least one additional element. A particularly good lattice matching of all the layers of at least one laser stack to the lattice constant of GaAs can be obtained in this way.

Particularly preferably, each waveguide layer and each cladding layer of each laser stack contain $Al_xGa_{1-x}As$, where $0 \leq x \leq 1$, and the at least one additional element. A particularly good lattice matching of all the layers of all the laser stacks to the lattice constant of GaAs can be obtained in this way.

As an alternative, however, it is also possible for not every waveguide layer or cladding layer of at least one laser stack to contain $Al_xGa_{1-x}As$, where $0 \leq x \leq 1$, and/or the at least one additional element, rather the laser diode chip has waveguide layers or cladding layers which do not contain $Al_xGa_{1-x}As$, where $0 \leq x \leq 1$, and/or an additional element.

A further configuration of the invention provides for the at least one additional element within the at least one waveguide layer or cladding layer to vary spatially in terms of its concentration. By way of example, the concentration of the additional element in one of the layers of a laser stack decreases in a direction of the active zone.

As a result, it is possible preferably to improve the lattice matching of the layer comprising the additional element to the two adjoining layers situated above and below the layer comprising the additional element.

Preferably, the at least one waveguide layer or cladding layer containing $Al_xGa_{1-x}As$, where $0 \leq x \leq 1$, and the additional element comprises at least one further additional element from main group III or V. This means that the at least one waveguide layer or cladding layer which comprises the additional element and the further additional element is composed of five or more components.

By way of example, one of the waveguide layers or cladding layers of the first laser stack contains phosphorus as additional element and indium as further additional element.

Preferably, the at least one waveguide layer or cladding layer contains InAlGaAsP, InAlGaAsPSb or AlGaAsPSb.

A further configuration of the invention provides for at least one further waveguide layer or cladding layer to comprise $Al_xGa_{1-x}As$, where $0 \leq x \leq 1$, and at least one further element from main group III or V, such that the lattice mismatch between the at least one further waveguide layer or cladding layer comprising the at least one further element and the semiconductor substrate composed of GaAs is reduced.

By way of example, the first cladding layer of the first laser stack contains $Al_xGa_{1-x}As$, where $0 \leq x \leq 1$, and as additional element phosphorus and, in addition, a further layer, for example the first waveguide layer of the second laser stack, contains $Al_xGa_{1-x}As$, where $0 \leq x \leq 1$, and a further element from main group III or V, for example nitrogen.

As a result, it is possible preferably to optimize the lattice matchings of both layers, that is to say for example of the first cladding layer of the first laser stack and, in addition, of the first waveguide layer of the second laser stack, to the lattice constant of the semiconductor substrate composed of GaAs by means of the additional element and by means of the further element that is different from the additional element.

Preferably, the lattice matching of each individual layer of the laser diode chip to the respective two adjoining layers is homogeneous. As a result, lattice mismatches that are identical in magnitude arise between all the layers of the laser diode chip and, consequently, a reduced constant stress can arise in the laser diode chip overall.

In a further configuration, the at least one waveguide layer or cladding layer comprising the at least one additional element and at least one adjoining layer have the same lattice constant. In this case, it is not absolutely necessary for each layer of the laser diode chip to have the same lattice constant, rather it is possible for small local lattice mismatches between individual layers of the laser diode chip to remain as long as the lattice mismatches of the laser diode chip are reduced overall.

Preferably, the at least one additional element is an element from main group V, wherein the proportion of the additional element among the elements of main group V in the at least one waveguide layer or cladding layer is at most 15%. By way of example, the waveguide layer or cladding layer contains $Al_xGa_{1-x}As_yP_{1-y}$, where $0 \leq x \leq 1$ and $1-y \leq 0.15$.

As an alternative, the at least one additional element is an element from main group III, wherein the proportion of the additional element among the elements of main group III in the at least one waveguide layer or cladding layer is at most 15%. By way of example, the waveguide layer or cladding layer contains $In_{1-x-z}Al_xGa_zAs_yP_{1-y}$, where $0 \leq x$, y, $z<1$, $x+z<1$, and $1-x-z \leq 0.15$.

For a matching of the lattice constant of a waveguide layer or cladding layer to the lattice constant of the semiconductor substrate, that is to say to the lattice constant of GaAs, for example the waveguide layer or cladding layer contains $Al_xGa_{1-x}As_yP_{1-y}$, where $0 \leq x \leq 1$ and $0.02 \leq 1-y \leq 0.03$. It is furthermore also possible for the waveguide layer or cladding layer to have a higher proportion of the additional element, for example phosphorus. By way of example, the waveguide layer or cladding layer contains $Al_xGa_{1-x}As_yP_{1-y}$, where $0 \leq x \leq 1$ and $1-y=0.08$, as a result of which a tensile stress would arise. If this waveguide layer or cladding layer additionally comprises a further element, for example In, which would tend to lead to a compressive stress, a lattice matching to the lattice constant of GaAs can likewise be achieved given a suitable composition of said waveguide layer or cladding layer.

Moreover, further embodiments are conceivable in which further compositions comprising elements from main group III and/or V are grown such that they are lattice-matched to GaAs in a suitable manner. Compositions of a layer comprising more than five components are also conceivable in this case.

Preferably, the waveguide layer or cladding layer contains $Al_xGa_{1-x}As_yP_{1-y}$, where $0 \leq x \leq 1$ and $1-y \leq 0.15$, or $Al_xGa_{1-x}As_yN_{1-y}$, where $0 \leq x \leq 1$ and $1-y \leq 0.10$.

As further element which increases the lattice constant of a waveguide layer or cladding containing $Al_xGa_{1-x}As_yP_{1-y}$ where $0 \leq x, y < 1$, and can thus reduce a tensile stress present, which can arise as a result of the phosphorus supplied, said waveguide layer or cladding layer preferably contains In or Sb. Preferably, the waveguide layer or cladding layer contains $In_{1-x-z}Al_xGa_zAs_yP_{1-y}$, where $0 \leq x, y, z < 1$ and $1-x-z \leq 0.15$, or $Al_xGa_zSb_{1-x-z}As_yP_{1-y}$, where $0 \leq x, y, z < 1$ and $1-x-z \leq 0.10$.

The laser diode chip can have two or three laser stacks, for example. In particular, it is also possible, however, for the laser diode chip to have four or more, particularly preferably even five or more, laser stacks. The arrangement of a multiplicity of monolithically integrated laser stacks in the laser diode chip is facilitated by means of at least one additional element from main group III or V with respect to $Al_xGa_{1-x}As$, where $0 \leq x \leq 1$, in at least one waveguide layer or cladding layer of at least one laser stack since, by virtue of the additional element, approximately no lattice mismatches between the semiconductor substrate composed of GaAs and the at least one waveguide layer or cladding layer and therefore also approximately no stresses between said layers occur that could lead to the destruction of the laser diode chip in the case of a multiplicity of monolithically integrated laser stacks.

In a further advantageous configuration, a tunnel junction is arranged between at least two laser stacks. The tunnel junction is preferably integrated in the semiconductor layer sequence and particularly preferably comprises two, preferably highly doped, layers of different conduction types. Particularly preferably, a tunnel junction is in each case arranged between all the laser stacks.

The respective active zone of the laser stacks preferably comprises a pn junction, a double heterostructure, a multiple quantum well structure (MQW) or particularly preferably a single quantum well structure (SQW) for generating radiation. In this case, the designation quantum well structure does not comprise any indication about the dimensionality of the quantization. It thus encompasses, inter alia, quantum wells, quantum wires and quantum dots and any combination of these structures.

In a further configuration, for the purpose of better heat dissipation, the laser diode chip can be mounted on a heat sink. The lifetime of the laser diode chips is additionally increased as a result.

Preferably, for making contact with the laser diode chip, a contact layer is applied on that surface of the semiconductor substrate which is remote from the laser stacks. For making contact further with the laser diode chip, a metallization is preferably applied on the laser stack remote from the substrate. Said metallization can be formed over the whole area or have a patterning.

Preferably, the laser diode chip is operated in the quasi-continuous (q-cw) operating mode with pulse lengths of preferably between 50 μs and 1500 μs, particularly preferably between 100 μs and 1000 μs, and a duty cycle of between 1% and 20%. Simulations show that the laser diode chip according to the invention can be operated over a long time and at high powers in this mode.

DETAILED DESCRIPTION OF THE DRAWINGS

Identical or identically acting constituent parts are in each case provided with the same reference symbols. The constituent parts illustrated and also the size relationships of the constituent parts among one another should not be regarded as true to scale.

Figure 1:
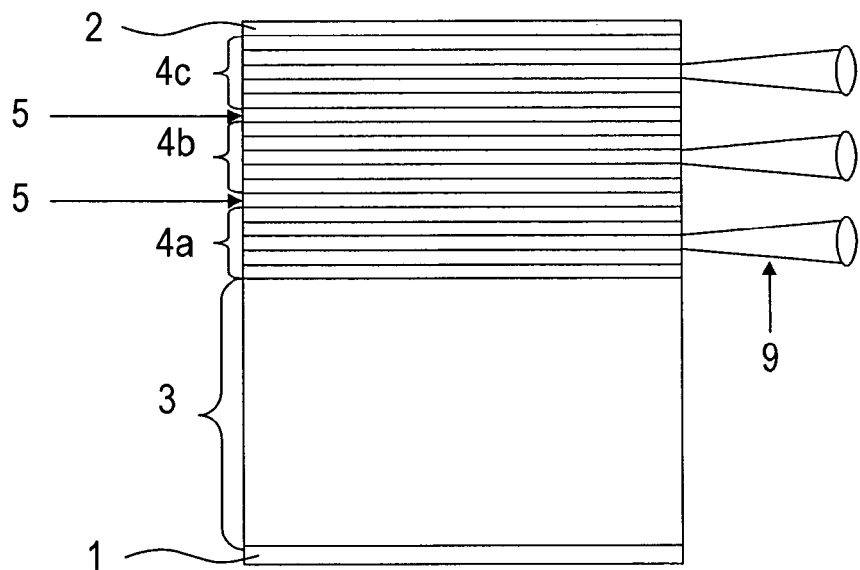
FIG. 1 shows a schematic cross section of a first exemplary embodiment of a laser diode chip according to the invention.

In the case of the radiation-emitting laser diode chip illustrated in FIG. 1, the laser diode chip has a rear side contact 1, a front side contact 2, a semiconductor substrate 3 composed of GaAs and three laser stacks 4a, 4b, 4c, which are in each case composed of a number of different layers and which in each case have at least one active zone that emits radiation (e.g. infrared radiation) during operation of the component.

The three monolithically integrated laser stacks 4a, 4b, 4c of the laser diode chip are arranged on a semiconductor substrate 3 composed of GaAs. The individual laser stacks are connected to one another by tunnel junctions 5.

Figure 2:
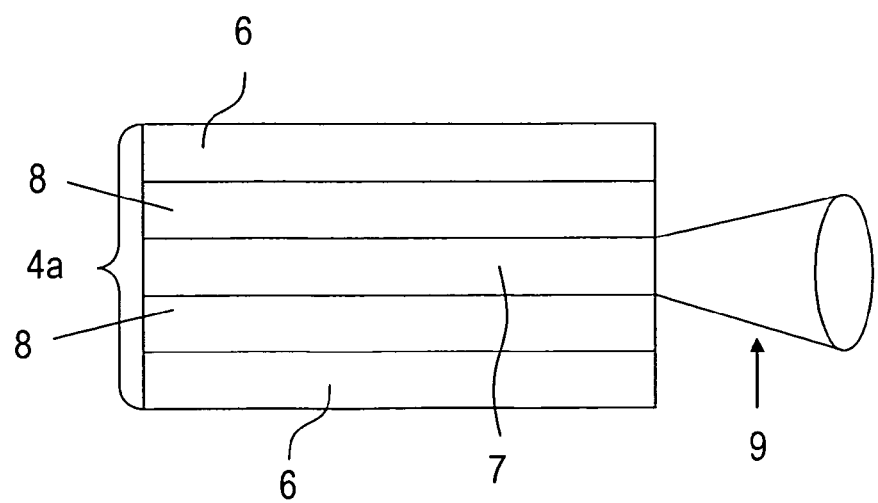
FIG. 2 shows a schematic enlarged illustration of a laser stack of the first exemplary embodiment of a laser diode chip according to the invention.

As can be seen from FIG. 2, the waveguide layers 8 of each monolithically integrated laser stack 4a, 4b, 4c surround the active zone 7 and adjoin cladding layers 6. By way of example, the bottom-most laser stack 4a contains a first cladding layer 6, a first waveguide layer 8 applied on the first cladding layer 6, an active zone 7 applied on the first waveguide layer 8, a second waveguide layer 8 applied on the active zone 7, and a second cladding layer 6 applied on the second waveguide layer 8.

As can be seen from FIG. 1, the second cladding layer 6 of the first laser stack 4a is adjoined by a tunnel junction 5 on which the corresponding layers of the second laser stack 4b are arranged. The laser stack 4b is followed by the laser stack 4c, wherein a further tunnel junction 5 is arranged between the laser stack 4b and the laser stack 4c.

The respective active zones 7 preferably contain InGaAs or AlInGaAs. As an alternative, however, the respective active zones 7 can also contain other materials.

The respective active zones 7 emit electromagnetic radiation from the infrared wavelength range, for example, when a current is applied to them. They can have e.g. a pn junction, a double heterostructure, a single quantum well structure (SQW structure) or a multiple quantum well structure (MQW structure). Such structures are known to the person skilled in the art and are, therefore, not explained in any greater detail at this point. The active zones each emit light at emission angles within a light cone 9.

In the laser diode chip, preferably both the waveguide layers 8 and the cladding layers 6 of the three laser stacks are in each case optimized by $Al_xGa_{1-x}As$, where $0 \leq x \leq 1$, and an additional element, for example phosphorus. Said layers preferably contain $Al_xGa_{1-x}As_yP_{1-y}$, where $0 \leq x < 1$ and $0 \leq y < 1$. However, said layers may contain further additional elements, such as In, Sb or N, for example, thus resulting in compositions comprising InAlGaAsP, InAlGaAsPSb or AlGaAsPSb.

By virtue of the additional element or the additional elements, the lattice constant of the waveguide layers 8 and cladding layers 6 approximates the lattice constant of the semiconductor substrate 3, which consists of GaAs, such that approximately no local stresses between adjacent layers occur. Particularly preferably, no lattice mismatches and therefore no stresses between adjacent layers occur. There is also the possibility of optimizing only individual waveguide layers 8 or cladding layers 6 of the laser stacks by means of one or a plurality of additional elements.

The layer sequences described above can be produced by means of molecular beam epitaxy, for example. Production is also possible by means of metal organic vapor phase epitaxy, vapor phase epitaxy or liquid phase epitaxy.

The description of the exemplary embodiment should not be regarded as a restriction to the number of individual layers. Individual waveguide layers or cladding layers can likewise be composed of a layer sequence. Likewise, in addition to the layers mentioned above, the laser diode chip can contain for example buffer layers, barrier layers, interlayers and/or junction layers. Furthermore, the individual layers of the laser diode chip can have different dopings.

The explanation of the laser diode chip according to the invention on the basis of the exemplary embodiment described above should not be regarded as a restriction of the invention thereto. Moreover, the invention encompasses any new feature and also any combination of features, which in particular comprises any combination of features in the patent claims, even if this feature or this combination itself is not explicitly specified in the patent claims or the exemplary embodiment.

The invention claimed is:

1. A monolithically integrated laser diode chip having a construction as a multiple beam laser diode, comprising:
   a semiconductor substrate comprised of GaAs;
   at least two laser stacks, which are arranged one above another on the semiconductor substrate and which each contain an active zone arranged between waveguide layers and the waveguide layers each adjoin a cladding layer at a side remote from the active zone,
   wherein at least one of the waveguide layers or cladding layers of at least one laser stack, comprises $Al_xGa_{1-x}As$, where $0 \leq x \leq 1$, and at least one additional element from main group III or V, such that the lattice mismatch between the at least one waveguide layer or cladding layer comprising the at least one additional element and the semiconductor substrate composed of GaAs is reduced;
   wherein the lattice constant of the at least one waveguide layer or cladding layer is reduced by the at least one additional element; and
   wherein the at least one waveguide layer or cladding layer is directly adjacent to the semiconductor substrate.

2. The laser diode chip as claimed in claim 1, wherein the at least one additional element is P, N, In or Sb.

3. The laser diode chip as claimed in claim 1, wherein at least one waveguide layer and at least one cladding layer or at least two waveguide layers or at least two cladding layers comprise AlxGa1-xAs, where $0 \leq x \leq 1$, and the at least one additional element.

4. The laser diode chip as claimed in claim 3, wherein at least one waveguide layer and at least one cladding layer or at least two waveguide layers or at least two cladding layers comprise the at least one additional element in different concentrations.

5. The laser diode chip as claimed in claim 1, wherein each waveguide layer and each cladding layer of at least one laser stack contain AlxGa1-xAs, where $0 \leq x \leq 1$, and the at least one additional element.

6. The laser diode chip as claimed in claim 1, wherein each waveguide layer and each cladding layer of each laser stack contain AlxGa1-xAs, where $0 \leq x \leq 1$, and the at least one additional element.

7. The laser diode chip as claimed in claim 1, wherein the at least one additional element within the at least one waveguide layer or cladding layer varies spatially in terms of its concentration.

8. The laser diode chip as claimed in claim 1, wherein the at least one waveguide layer or cladding layer comprises at least one further additional element from main group III or V.

9. The laser diode chip as claimed in claim 8, wherein the at least one waveguide layer or cladding layer contains InAlGaAsP, InAlGaAsPSb or AlGaAsPSb.

10. The laser diode chip as claimed in claim 1, wherein at least one further waveguide layer or cladding layer comprises AlxGa1-xAs, where $0 \leq x \leq 1$, and at least one further element from main group III or V, such that the lattice mismatch between the at least one further waveguide layer or cladding layer comprising the at least one further element and the semiconductor substrate composed of GaAs is reduced.

11. The laser diode chip as claimed in claim 1, wherein the at least one waveguide layer or cladding layer comprising the at least one additional element and the semiconductor substrate composed of GaAs have the same lattice constant.

12. The laser diode chip as claimed in claim 1, wherein the at least one additional element is an element from main group V, wherein the proportion of the additional element among the elements of main group V in the at least one waveguide layer or cladding layer is at most 15%.

13. The laser diode chip as claimed in claim 1, wherein the at least one additional element is an element from main group III, wherein the proportion of the additional element among the elements of main group III in the at least one waveguide layer or cladding layer is at most 15%.

14. The laser diode chip as claimed in claim 1, wherein the laser stacks are connected to one another by tunnel junctions.

* * * * *